(12) United States Patent
Dautartas et al.

(10) Patent No.: US 6,512,291 B2
(45) Date of Patent: Jan. 28, 2003

(54) FLEXIBLE SEMICONDUCTOR DEVICE SUPPORT WITH INTEGRATED THERMOELECTRIC COOLER AND METHOD FOR MAKING SAME

(75) Inventors: Mindaugas F. Dautartas, Blacksburg, VA (US); Joseph M. Freund, Fogelsville, PA (US); George J. Przybylek, Douglasville, PA (US)

(73) Assignee: Agere Systems Inc., Miami Lakes, FL (US)

( * ) Notice: Subject to any disclaimer, the term of this patent is extended or adjusted under 35 U.S.C. 154(b) by 0 days.

(21) Appl. No.: 09/790,811

(22) Filed: Feb. 23, 2001

(65) Prior Publication Data

US 2002/0117747 A1 Aug. 29, 2002

(51) Int. Cl.⁷ ........................... H01L 23/10; H01L 23/34
(52) U.S. Cl. ...................... 257/706; 257/707; 257/930
(58) Field of Search .................... 257/930, 706, 257/707, 712, 710, 432, 431, 433, 434, 704

(56) References Cited

U.S. PATENT DOCUMENTS

| | | | | |
|---|---|---|---|---|
| 2,984,696 A | * | 5/1961 | Shaffer | |
| 3,991,742 A | * | 11/1976 | Gerber | |
| 4,106,952 A | * | 8/1978 | Kravitz | |
| 4,935,864 A | | 6/1990 | Schmidt et al. | |
| 5,385,022 A | * | 1/1995 | Kornblit | |
| 5,528,083 A | | 6/1996 | Malladi et al. | |
| 5,918,469 A | | 7/1999 | Cardella | |
| 5,956,234 A | | 9/1999 | Mueller | |
| 5,956,569 A | | 9/1999 | Shiu et al. | |
| 6,219,364 B1 | * | 4/2001 | Dei | |
| 6,281,425 B1 | * | 8/2001 | Price | |

OTHER PUBLICATIONS

*Using Flex Circuits In Optical Drives*, by Tom Woznicki, Jan./Feb. 1988.

* cited by examiner

*Primary Examiner*—Sheila V. Clark
(74) *Attorney, Agent, or Firm*—Dickstein Shapiro Morin & Oshinsky LLP

(57) ABSTRACT

A method and apparatus are disclosed for supporting semiconductor devices on a flexible support which includes one or more thermoelectric cooling devices. The thermoelectric cooling devices, which include at least one pair of positively-doped and negatively-doped elements electrically coupled together, are positioned between a pair of flex panels. Each panel has connector sites at which connectors such as solder balls are located. The thermoelectric cooling devices may be arranged between the panels to create two or more device support areas having different temperature regimes. The thermoelectric cooling devices may be connected to the panels by placing the panels, connectors and thermoelectric cooling devices in a reflow chamber, exposing them to a reducing atmosphere, and heating to a temperature sufficient to reflow the connectors.

18 Claims, 4 Drawing Sheets

FLEXIBLE SEMICONDUCTOR DEVICE SUPPORT WITH INTEGRATED THERMOELECTRIC COOLER AND METHOD FOR MAKING SAME

FIELD OF THE INVENTION

The invention is generally related to the fabrication of a flexible semiconductor device support, and more particularly to the incorporation of thermoelectric cooling devices in such a support.

BACKGROUND

Semiconductor devices are formed by fabricating one or more electrical devices on a semiconductor substrate. Optoelectronic devices fall within a class of semiconductor devices designed to convert between electrical signals and optical signals. Many optoelectronic devices, particularly light emitting devices, work at optimal efficiency when operating at or within a predetermined temperature or temperature range. However, during use such devices generate an amount of heat sufficient to elevate the temperature at which they are operating above the predetermined temperature or temperature range, thus decreasing operational efficiency.

It is known to associate thermoelectric coolers and associated feedback control with such optoelectronic devices to maintain operation at or within a predetermined temperature or temperature range. Thermoelectric coolers are used to offset the heat generation of some optoelectronic devices or to prevent a build-up of heat which will reduce operating efficiency. The incorporation of thermoelectric coolers with optoelectronic devices has required hybrid packaging schemes, and it has added to the expense of fabrication and added complexity to the fabrication of commercial devices.

SUMMARY

The invention provides a flexible support for a semiconductor device, the support having an integrated heat transfer device. The flexible support includes a flexible first panel, a flexible second panel, with at least one of the first and second panels containing an external surface for mounting a semiconductor device, and at least one heat transfer device positioned between and connected to the first and second panels.

The invention also provides a semiconductor device structure including a flexible semiconductor device support having integrated heat transfer devices and at least one semiconductor device connected with at least one of said heat transfer devices. The semiconductor device support includes a flexible first panel, a flexible second panel, and at least one heat transfer device positioned between and connected to the first and second panels.

The invention also provides a method of assembling a semiconductor package. The method includes locating one or more heat transfer devices between a pair of flexible panels, at least one of the panels providing a semiconductor device support surface, and connecting the heat transfer devices to the panels. The package may be used to support a semiconductor device, such as, for example, an optoelectric semiconductor device.

These and other advantages and features of the invention will be more readily understood from the following detailed description which is provided in connection with the accompanying drawings.

DETAILED DESCRIPTION OF PREFERRED EMBODIMENTS

Figure 1:
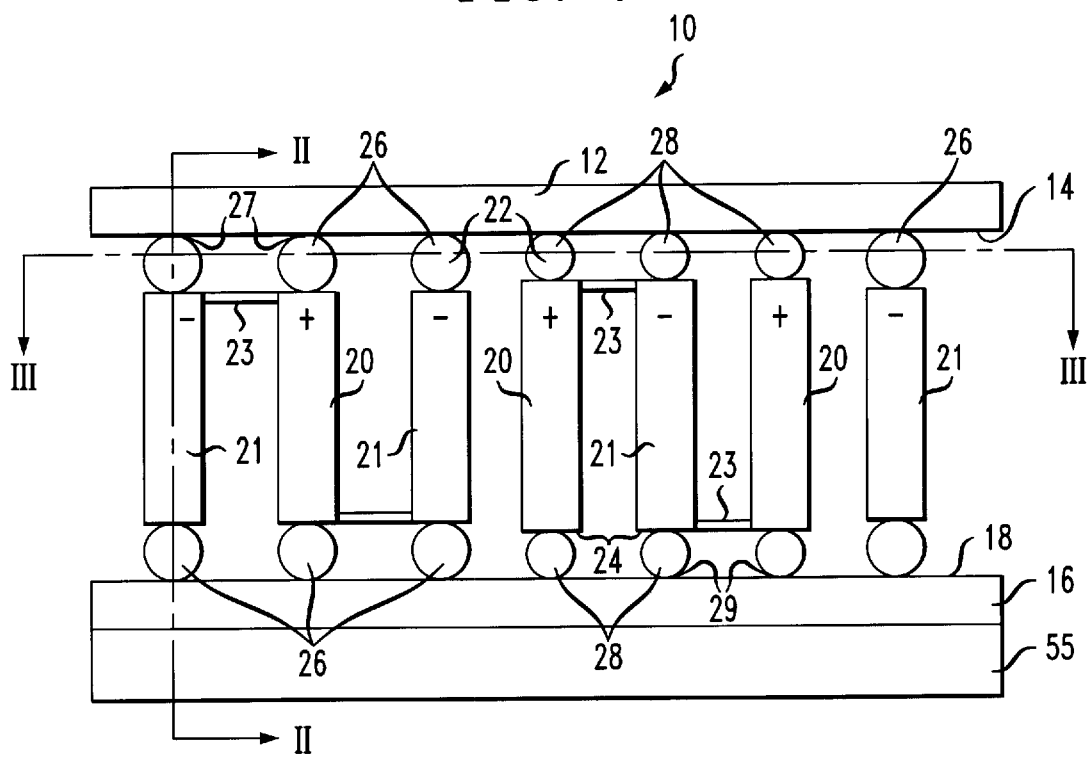
FIG. 1 is a side view of a flexible semiconductor device support constructed in accordance with an embodiment of the invention.
Figure 2:
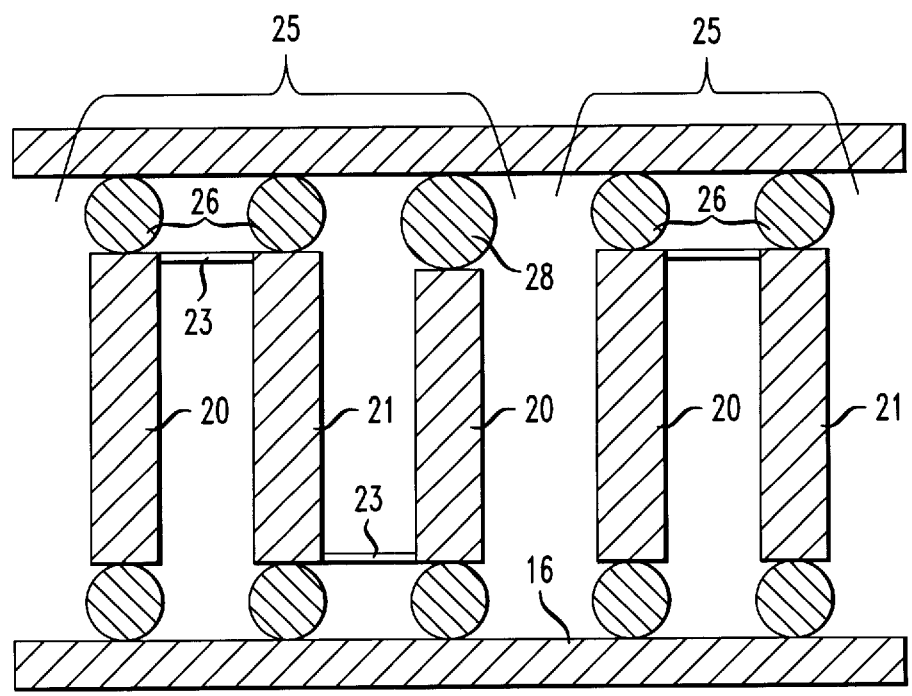
FIG. 2 is a cross-sectional view taken along line II—II of FIG. 1.

FIGS. 1–4 illustrate a flexible semiconductor device support 10 having a flexible first panel 12 and a flexible second panel 16. The first panel 12 includes a surface 14. The second panel 16 has a surface 18 which faces the surface 14 when the support 10 has been assembled. The panels 12, 16 are formed from a material capable of providing flexure to the support 10 and are well known in the industry. Exemplary materials used for forming the panels 12, 16 include polymers, such as polyimides, and films.

Figure 3:
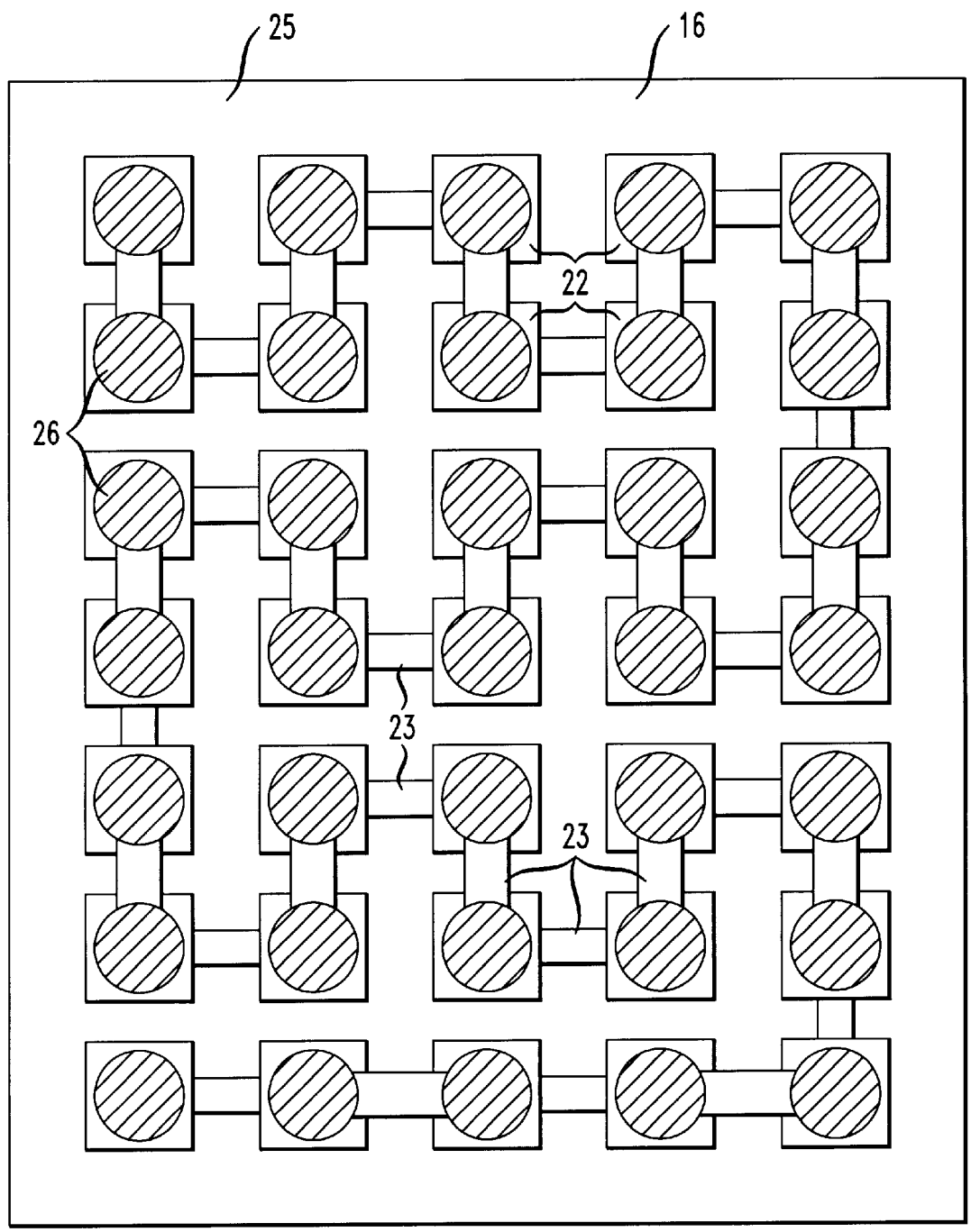
FIG. 3 is a cross-sectional view taken along line III—III of FIG. 1.

Positioned between the panels 12, 16 are a plurality of heat transfer devices. While many types of heat transfer devices can be used in the invention, the invention will be described using thermoelectric cooling (TEC) devices including TEC elements as exemplary heat transfer devices. TEC elements 20, 21 are preferably formed of a suitable semiconductor material, such as, for example, bismuth telluride. Each TEC element 20, 21 has a first end 22 and an opposing second end 24. The TEC elements 20 are positively-doped, while the TEC elements 21 are negatively-doped. Each of the TEC elements 20, 21 are electrically coupled through a connector 23, which is formed of an electrically conductive material, such as gold. While the connectors 23 have been shown connecting elements 20 and 21 at ends of the elements (FIGS. 1–4), the connectors 23 may instead be on the surfaces 14, 18 and connecting the elements 20, 21 through the solder balls 26, 28. At least one pair, but preferably a plurality of pairs, of elements 20, 21 form an active TEC device 25. As shown in FIG. 3, all of the TEC elements 20, 21 are interconnected in a three-dimensional serpentine fashion to create a single TEC device 25. Several such devices 25 can be placed between the flexible panels 12, 16.

The TEC devices 25 transfer heat by biasing a voltage across one of the elements 20, 21, causing one of the ends 22, 24 to cool and the other of the ends 22, 24 to heat. A heat sink 55 (FIGS. 1–2) is positioned near and thermally connected with the ends 22 or 24 which are heated. For example, a bias voltage may be applied to a TEC element 21 to cause the end 22 to become cooled and the end 24 to be heated. The bias voltage may be reversed, or the TEC device 25 flipped around, to cause the ends 22 to become heated and the ends 24 to be cooled. Active TEC devices 25 which can be controlled by a control signal are desirable since over time the output of a semiconductor device varies, requiring numerous corrections to address the output changes. Examples of suitable TEC devices 25 may be found in "Thermoelectric Cooling Systems Design Guide," Marlow Industries, Inc. (1998), the entire contents of which is hereby incorporated by reference.

Conductive connectors are utilized to connect the TEC elements 20, 21 to the flexible panels 12, 16. Specifically, solder balls of varying sizes, such as solder balls 26 and 28 (FIG. 2) are used to connect the TEC elements 20, 21 to the panels 12,16. Preferably, a solder ball 26 or 28 may be located opposite the first end 22 of one TEC element 20, 21 and on a connector site 27, on the inner surface 14 of the first panel 12. Likewise, a solder ball 26 or 28 may be located opposite the second end 24 of one TEC element 20, 21 and on a connector site 29 on the inner surface 18 of the second panel 16. The connector sites 27, 29 are preferably pads formed of thermally and electrically conductive material, such as, for example, gold, silver, aluminum, copper, palladium, or the like.

Each TEC device 25 may be dimensioned and sized different than other TEC devices 25 incorporated into the flexible support 10. Since no two TEC devices 20 need be of the same linear extent, connectors of varying size, such as the solder balls 26, 28, are used to ensure connection of the elements 20, 21 of each TEC device 25 with the panels 12, 16.

Although the flexible support 10 is shown in FIG. 3 as having a five by seven grid array of TEC elements 20, 21 which are positioned between the panels 12 and 16, it is to be understood that any number of TEC elements 20,21 may be interconnected in the flexible support 10 to form a TEC device 25. Further, any number of TEC devices 25 may be placed between the flexible panels 12, 16. In some locations, support elements 31 (FIG. 4) may extend between the panels 12, 16 in place of the TEC elements 20, 21. The support elements 31 may be made of the same flexible material as the panels 12, 16, or another material suitable for providing support, and serve to fill in the space that could have been occupied by a TEC element 20, 21.

Figure 4:
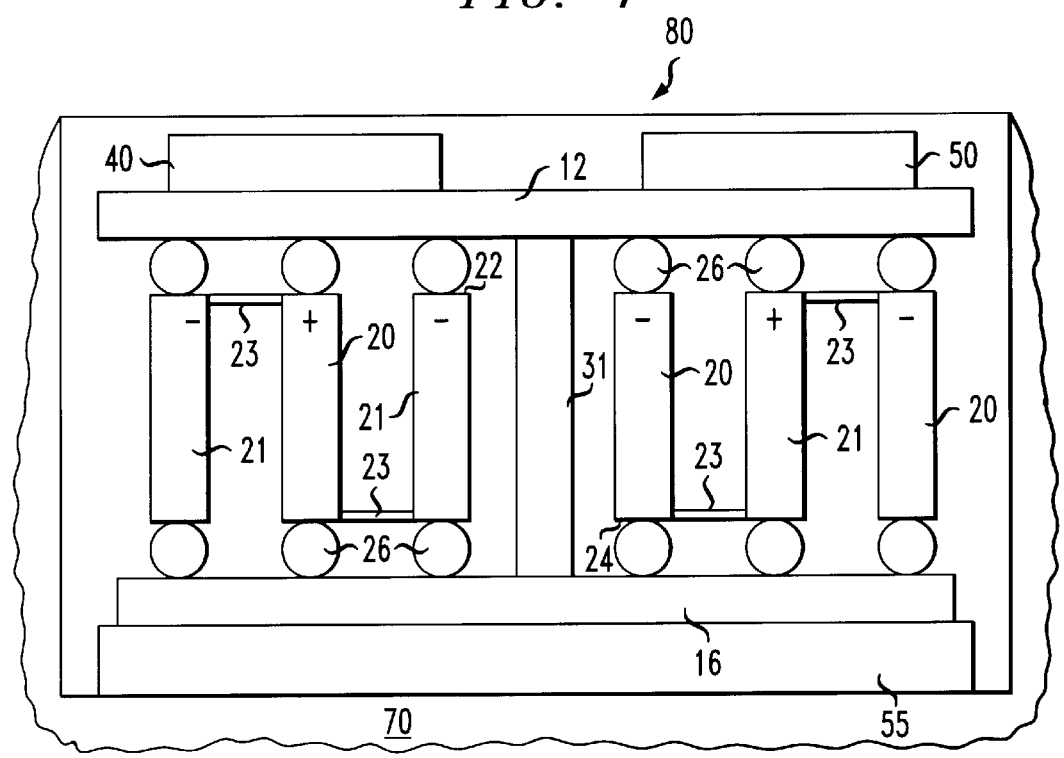
FIG. 4 is a side view of a flexible semiconductor device support constructed in accordance with another embodiment of the invention.

FIG. 4 shows a flexible support 80 including a pair of semiconductor devices mounted on an outward facing surface of the first flexible panel 12. For example, a pair of optoelectronic devices, a transmitter 40, such as a laser chip, and a receiver 50, such as a photodetector, are mounted on an outward facing surface of the first flexible panel 12. If desired, semiconductor devices, for example optoelectonic devices, may also be mounted on the outward facing surface of panel 16. For optoelectronic devices mounted on the panel 16 and requiring cooling, obviously the ends 24 of respective TEC elements 20, 21 would have to be cooled (either by reversing the bias voltage on that TEC device 25 or flipping the TEC device 25, as described above). The transmitter 40 is connected through the panel 12 with one or more TEC devices 25, and the receiver 50 is also connected through the panel 12 but with one or more other TEC devices 25. The flexible support 80 may be mounted within a container or other support element 70 which may be fabricated of, for example, Kovar, such that the heat sink 55 rests on a surface 72. In this exemplary arrangement, semiconductor devices are not supported by the outward surface of the panel 16.

The flexible support 10 may be incorporated within the container 70 by soldering feed-through connectors, from a larger circuit board, such as a mother board or other printed circuit board (PCB), to the container 70 and using wire or ribbon bonds to connect the feed-through connectors to the flexible support 10. Alternatively, edge connectors may be incorporated into the flexible support 10, allowing the flexible support 10 to be directly plugged into the larger circuit board.

Since each semiconductor device, such as the optoelectronic devices 40, 50 illustrated, has its own cooling needs, each TEC device 25 may be arranged within the flexible support 10 to provide the desired cooling needs for a particular device. In this way, the flexible support 10 may be designed to have a multitude of different areas, each being controlled at a different temperature. Thus, two or more semiconductor devices, each having different cooling needs, may be incorporated into a flexible support 10 and operated at optimal efficiency without affecting the efficiency of any other semiconductor device.

Figure 5:
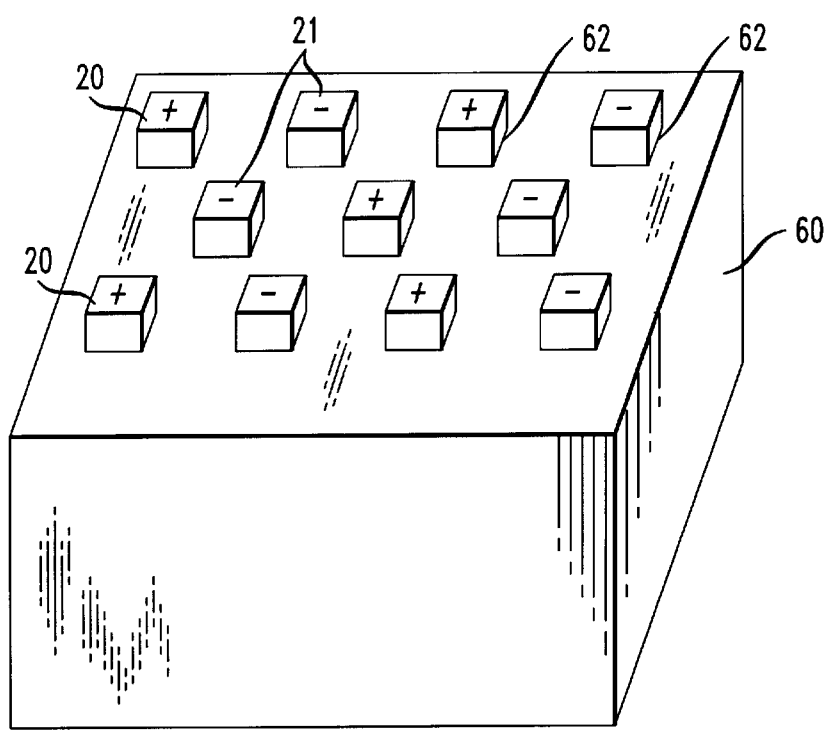
FIG. 5 is a perspective view of a holding matrix used in constructing the flexible semiconductor device support of FIG. 1.

FIG. 5 shows a holding matrix 60 which may be used in the assembly of the flexible support 10. The matrix 60 may be a generally rectangular structure including numerous openings 62. Each opening 62 is sized to snuggly receive a TEC element 20, 21 to prevent lateral movement or tipping of the TEC elements during assembly operations designed to connect the TEC devices 25 to the flex panels 12, 16.

Figure 6:
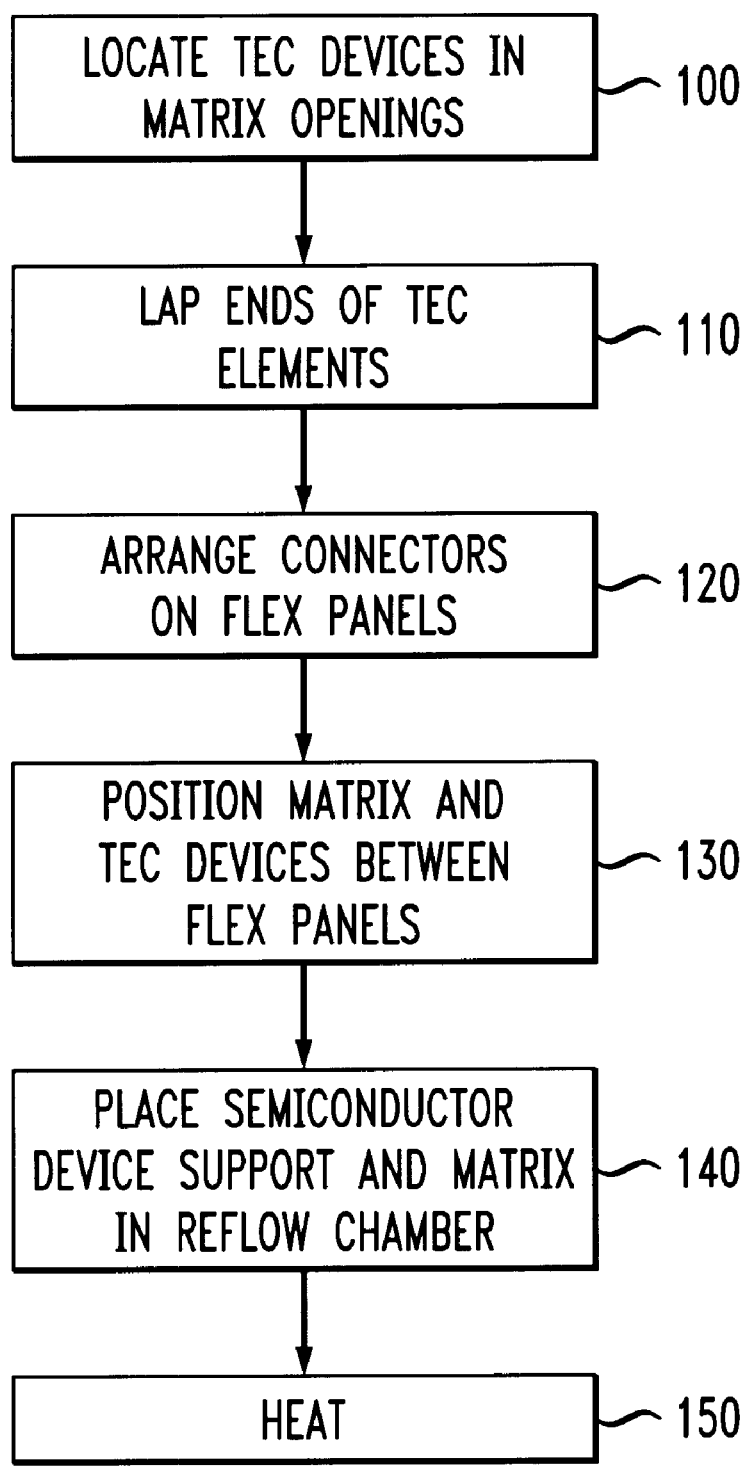
FIG. 6 is a flow diagram illustrating steps for constructing the flexible semiconductor device support of FIG. 1.

Next, with reference to FIG. 6, will be described a method for constructing the flexible support 10. The TEC elements 20, 21 are located in the matrix openings 62 at step 100. One way to perform step 100 may be to pour a curable material around the TEC elements 20, 21 and cure the material to create the matrix 60. The ends 22, 24 of the TEC elements 20, 21 are then smoothed, or lapped, by a lapping machine at 110 to provide good contact for connectors.

At step 120, connectors, such as the solder balls 26, 28, are arranged on the surfaces 14, 18 of the first and second panels 12, 16. The matrix 60 and TEC devices 25 are arranged between the flexible panels 12, 16 at step 130 such that each connector is matched up with an end 22 or 24 of a TEC element 20, 21. At step 140, the flexible support 10, along with the matrix 60, is placed in a reflow chamber which has a reducing atmosphere, such as formic acid. The reducing atmosphere serves as a flux to eliminate oxides from the ends 22, 24 of the TEC devices 25. The reflow chamber is then heated at step 150 to a temperature sufficient to reflow the connectors 26, 28 to adhere connector sites 27, 29 of the panels 12, 16 to the ends 22, 24 of the TEC elements 20, 21.

Preferably, the material used to form the matrix 60 melts at or just below the temperature necessary to reflow the connectors. Thus, as the connectors reflow to connect the panels 12, 16 to the TEC devices 25, the matrix 60 melts away, leaving a flexible support 10 with incorporated TEC devices 25. Alternatively, the matrix 60 may be formed of several portions which are adhered one to the other via a temperature sensitive material that loses its adhering properties at a predetermined elevated temperature. Thus, during step 150, the matrix 60 disassembles as the connectors reflow.

While the foregoing has described in detail exemplary embodiments of the invention, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described and illustrated with reference to flexible panels 12, 16, non-flexible support panels 12 and 16 can also be used. Additionally, as noted above, although TEC devices 25 have been described as being located in regions where heat removal is necessary, other applications may require, instead of cooling, the addition of heating. Thus, the TEC devices 25 may have their operating characteristics reversed to provide heat. Further, other heat transfer devices may be incorporated within the flexible supports described herein. Accordingly, the invention is not to be seen as limited by the foregoing description, but is only limited by the scope of the appended claims.

What is claimed as new and desired to be protected by Letters Patent of the United States is:

1. A semiconductor device structure comprising:
    a semiconductor device support including:
        a first panel;
        a second panel; and
        at least two thermoelectric cooling devices arranged to provide two or more areas of at least one of said first and second panels with different temperature characteristics; and
    at least one optoelectronic device positioned on one of said panels.

2. The semiconductor device structure of claim 1, wherein said thermoelectric cooling devices each have at least one positively-doped thermoelectric cooling element and at least one negatively-doped thermoelectric cooling element.

3. The semiconductor device structure of claim 2, wherein said panels include a plurality of connector sites for connecting said thermoelectric cooling elements with both said panels.

4. The semiconductor device structure of claim 3, further comprising a plurality of connectors formed of a meltable material for connecting each said thermoelectric cooling element to a pair of said connector sites, one on each said panel.

5. The semiconductor device structure of claim 4, wherein said meltable material comprises solder balls.

6. The semiconductor device structure of claim 1, wherein said first and second panels comprise a flexible material.

7. The semiconductor device structure of claim 6, wherein said flexible material comprises a film.

8. The semiconductor device structure of claim 6, wherein said flexible material comprises a polymer.

9. The semiconductor device structure of claim 1, wherein said optoelectronic device comprises an optical receiver mounted on one of said panels and in connection with one or more heat transfer devices.

10. The semiconductor device structure of claim 1, wherein said optoelectronic device comprises a transmitter mounted on one of said panels and in connection with one or more heat transfer devices.

11. A semiconductor device support comprising:
    a first panel and a second panel, at least one of said first and second panels containing an external surface for mounting an optoelectronic device; and
    a plurality of heat transfer devices connected to said panels, wherein said heat transfer devices are thermoelectric cooling devices, each having at least one positively-doped thermoelectric cooling element and at least one negatively-doped thermoelectric cooling element, said thermoelectric cooling devices being arranged to provide two or more areas of at least one of said first and second panels with different temperature characteristics;
    wherein said heat transfer devices are adapted to actively cool the optoelectronic device through said panels.

12. The semiconductor device support of claim 11, further comprising:
    a plurality of connector sites on said panels, for connecting each said thermoelectric cooling elements with said panels; and
    a plurality of connectors comprising a meltable material.

13. The semiconductor device support of claim 12, wherein said meltable material comprises solder balls.

14. The semiconductor device support of claim 11, wherein at least one of said panels comprises a flexible material.

15. The semiconductor device support of claim 14, wherein said flexible material comprises a film.

16. A method of assembling a semiconductor device structure comprising the acts of:
    locating one or more thermoelectric cooling devices between a pair of panels, wherein at least one of said panels provides a semiconductor device support surface and at least one of said panels is adapted to provide connection of all of said thermoelectric cooling devices to said panels; and
    thermally connecting said thermoelectric cooling devices to said panels, wherein said connecting of said heat transfer devices to said panels comprises:
    positioning meltable connectors between connector sites provided at said panels and the ends of the heat transfer devices;
    placing the structure within a reflow chamber;
    exposing the structure to a reducing atmosphere; and
    heating the reflow chamber to reflow the connectors.

17. The method of claim 16, further comprising mounting at least one optoelectronic device to said support surface.

18. The method of claim 16, wherein said connecting of said heat transfer devices to said panels comprises:
    connecting said heat transfer devices to one of said panels; and
    flexing at least one of said panels so as to provide connection between all of said heat transfer devices and both said panels, at least one of said panels being formed of a flexible material.

* * * * *